(12) United States Patent
Han et al.

(10) Patent No.: US 9,123,599 B2
(45) Date of Patent: Sep. 1, 2015

(54) DISPLAY DEVICE AND METHOD OF MANUFACTURING THE SAME

(71) Applicant: LG Display Co., Ltd., Seoul (KR)

(72) Inventors: Seung-Hun Han, Daegu (KR); Seung-Hak Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 14/097,592

(22) Filed: Dec. 5, 2013

(65) Prior Publication Data

US 2014/0183567 A1  Jul. 3, 2014

(30) Foreign Application Priority Data

Dec. 27, 2012  (KR) .................... 10-2012-0154242

(51) Int. Cl.
 *H01L 29/18* (2006.01)
 *H01L 27/12* (2006.01)
 *H01L 27/32* (2006.01)
 *G02F 1/1345* (2006.01)

(52) U.S. Cl.
 CPC ........ *H01L 27/1296* (2013.01); *G02F 1/13452* (2013.01); *H01L 27/3223* (2013.01); *H01L 27/3276* (2013.01)

(58) Field of Classification Search
 CPC .................... H01L 27/3223; H01L 27/1296
 USPC ............................................ 349/152; 257/88
 See application file for complete search history.

(56) References Cited

U.S. PATENT DOCUMENTS

2012/0211772 A1* 8/2012 Moh et al. .................. 257/88
2013/0077005 A1* 3/2013 Kim et al. .................. 349/40

* cited by examiner

*Primary Examiner* — Ajay K Arora
(74) *Attorney, Agent, or Firm* — Fenwick & West LLP

(57) ABSTRACT

A display device includes a data IC including a plurality of dummy output pads, and a plurality of signal output pads that are positioned at both sides of the plurality of dummy output pads; a plurality of dummy data pads and a plurality of signal input data pads in a non-display region of an array substrate of a display panel, the plurality of dummy data pads corresponding to the plurality of dummy output pads, and the plurality of signal input data pads corresponding to the plurality of the signal output pads; and a plurality of data link lines in the non-display region, and connected between the plurality of signal input data pads and the plurality of data lines in a display region of the display panel.

10 Claims, 3 Drawing Sheets

DISPLAY DEVICE AND METHOD OF MANUFACTURING THE SAME

CROSS REFERENCE TO RELATED APPLICATION

The present invention claims the benefit of Korean Patent Application No. 10-2012-0154242, filed in Korea on Dec. 27, 2012, which is hereby incorporated by reference for all purposes as if fully set forth herein.

BACKGROUND OF THE INVENTION

1. Field of the Invention

The present invention relates to a display device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panel (PDP) devices, field emission display (FED) devices, and organic electro-luminescence display (ELD) devices, as a substitute for CRTs.

Particularly, an active matrix type display device including a switching transistor in each of a plurality of pixel regions arranged in a matrix form is widely used.

The display device includes a display panel including pixels in a matrix form, and a driving integrated circuit (IC) controlling the display panel.

FIG. 1 is a schematic view illustrating a portion where a display panel and a data IC are connected according to the related art.

Referring to FIG. 1, a data IC DIC is mounted on a flexible circuit film FF and is connected to an array substrate 111 of a display panel. A data link line DLL connected to a data line DL is formed at the array substrate 111 of the display panel, and a data pad is formed at an end of the data link line DLL.

The data pad is electrically connected to an output pad of the data IC DIC and supplied with a data voltage output from the output pad.

The data link lines DLL have different lengths according to positions thereof, and thus there occurs differences of resistance among the data link lines DLL.

To minimize defects due to the differences of resistance, a difference of resistance between the data link lines positioned at a center portion and at an outermost portion is required to be 200 Ω or less. Accordingly, considering the resistance of the data link line DLL at the center portion having a short length, there is a limit to the reduction of width of a non-display region where the data link lines DLL are formed.

Accordingly, reduction of a bezel that is a frame region of the display device is limited, and thus it is difficult to obtain a narrow bezel.

SUMMARY OF THE INVENTION

Accordingly, the present invention is directed to a display device and a method of manufacturing the same which substantially obviates one or more of the problems due to limitations and disadvantages of the related art.

An advantage of the present invention is to provide a display device and a method of manufacturing the same that can obtain a narrow bezel.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, a display device includes a data IC including a plurality of dummy output pads, and a plurality of signal output pads that are positioned at both sides of the plurality of dummy output pads; a plurality of dummy data pads and a plurality of signal input data pads in a non-display region of an array substrate of a display panel, the plurality of dummy data pads corresponding to the plurality of dummy output pads, and the plurality of signal input data pads corresponding to the plurality of the signal output pads; and a plurality of data link lines in the non-display region, and connected between the plurality of signal input data pads and the plurality of data lines in a display region of the display panel.

In another aspect, a method of manufacturing a display device includes: forming a display panel; and coupling a data IC to the display panel, wherein the data IC includes a plurality of dummy output pads, and a plurality of signal output pads that are positioned at both sides of the plurality of dummy output pads, and wherein the display panel includes: a plurality of dummy data pads and a plurality of signal input data pads in a non-display region of an array substrate, the plurality of dummy data pads corresponding to the plurality of dummy output pads, and the plurality of signal input data pads corresponding to the plurality of the signal output pads; and a plurality of data link lines in the non-display region, and connected between the plurality of signal input data pads and the plurality of data lines in a display region of the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
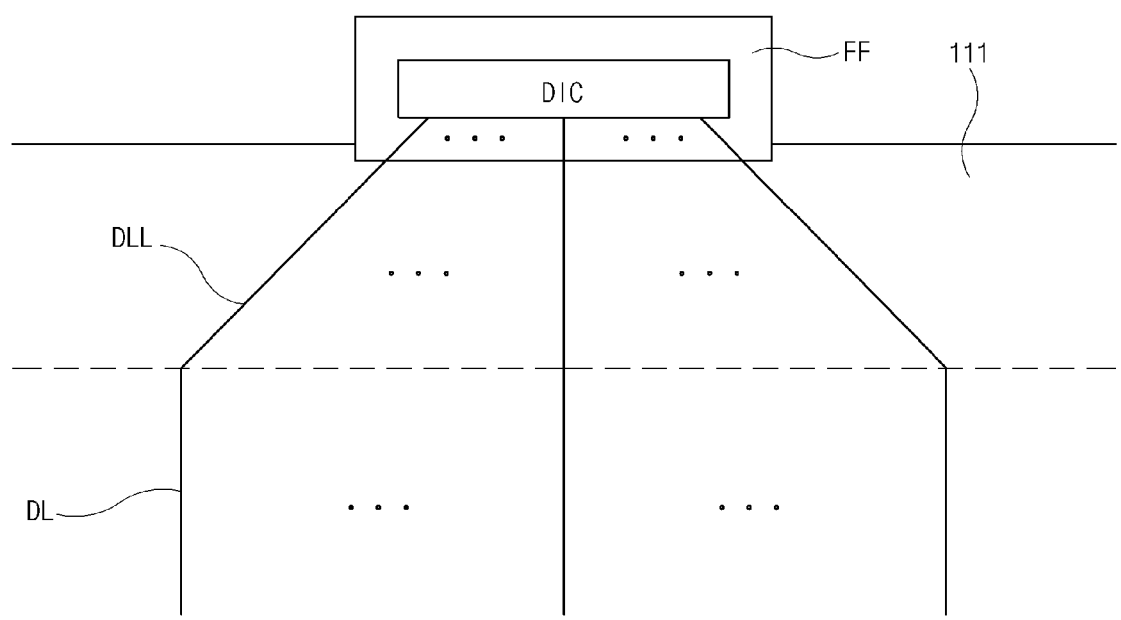
FIG. 1 is a schematic view illustrating a portion of a display device where a display panel and a data IC are connected according to the related art.
Figure 2:
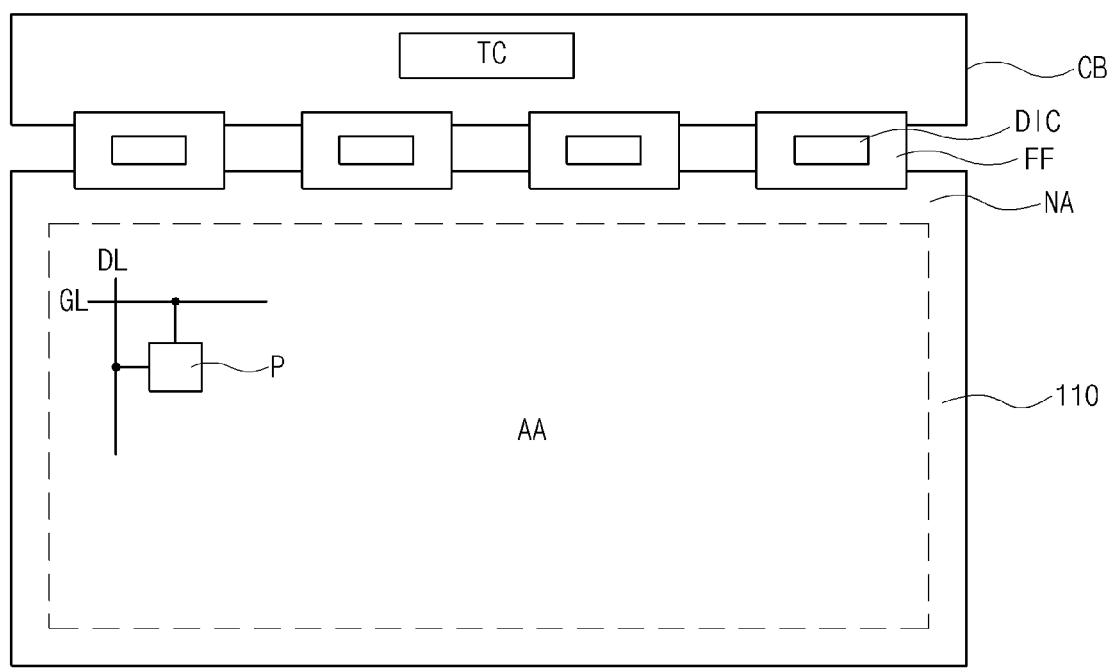
FIG. 2 is a schematic view illustrating a display device according to an embodiment of the present invention.
Figure 3:
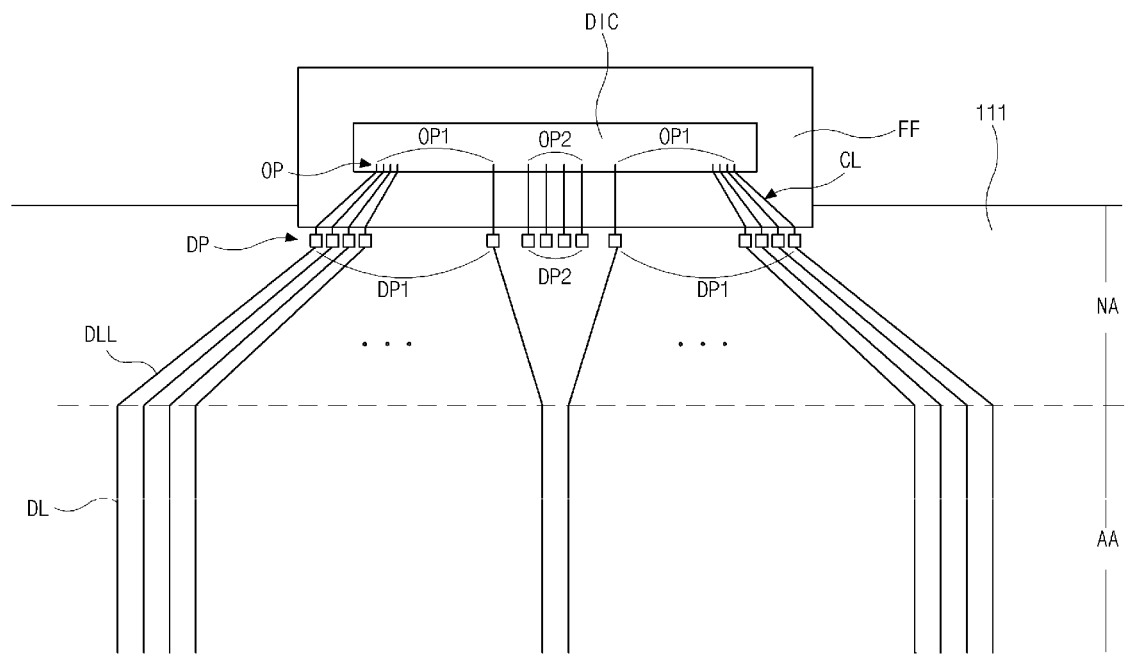
FIG. 3 is a view enlarging a connection portion of a display panel and a data IC of FIG. 2, according to an embodiment of the present invention.
Figure 4:
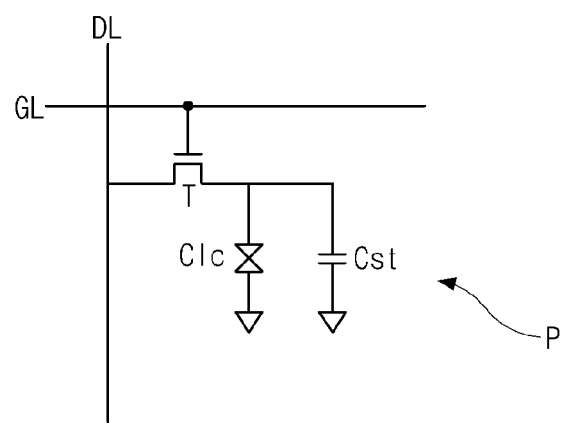
FIG. 4 is a circuit diagram illustrating an example of a pixel of the display device according to an embodiment of the present invention.

FIG. 2 is a schematic view illustrating a display device according to an embodiment of the present invention, FIG. 3 is a view enlarging a connection portion of a display panel and a data IC of FIG. 2, and FIG. 4 is a circuit diagram illustrating an example of a pixel of the display device according to an embodiment of the present invention.

Referring to FIGS. 2 to 4, the display device 100 includes a display panel 110 and a driving circuit portion driving the display panel 110.

The driving circuit portion may include a data driving circuit, a gate driving circuit, and a driving board CB.

The display panel 100 may include an array substrate 111 including array elements, and an opposing substrate facing the array substrate 111. The display panel 110 includes a display region AA to display images, and a non-display region NA surrounding the display region AA.

A plurality of pixels P are arranged in a matrix form in the display region AA. The pixel P is connected to a gate line GL along a row direction and a data line DL along a column direction.

The pixels P may include red, green and blue pixels. For example, the red, green and blue pixels are arranged alternately along the row direction, and the successive red, green and blue pixels constitute an image display unit.

As the display panel 110, various display panels may be used, for example, a liquid crystal display panel, a field emission display panel, a electroluminescent display panel including an inorganic electroluminescent display panel and an organic light emitting diode panel, or an electrophoresis display panel. When the liquid crystal panel is used, a backlight unit is further required for the display device 100.

In case that uses the liquid crystal panel, structure of the pixel P is explained with reference to FIG. 4.

The pixel P may include a switching transistor T connected to the gate lines GL and data lines DL, and a liquid crystal capacitor Clc.

The liquid crystal capacitor Clc includes a pixel electrode, a common electrode inducing an electric field along with the pixel electrode, and a liquid crystal layer therebetween. The pixel may further include a storage capacitor Cst connected in parallel with the liquid crystal capacitor Clc.

When a gate voltage is applied to the gate line GL, the switching transistor T is turned on. In response to this, a data voltage is applied to the pixel electrode through the data line DL. Accordingly, an electric field is induced by the data voltage applied to the pixel electrode and a common voltage applied to the common electrode, and thus images are displayed.

In the non-display region NA of the array substrate 111, data link lines DLL connected to the respective data lines DL are formed at a side of the data driving circuit. A data pad DP as a signal input pad is formed at an end of the data link line DLL.

A timing controller TC controlling the gate driving circuit and the data driving circuit may be mounted on the driving board CB.

The timing controller TC is supplied with external timing signals, such as a horizontal synchronizing signal, a vertical synchronizing signal, a data enable signal and a dot clock, from an external host system through an interface, such as a LVDS (low voltage differential signaling) interface, and/or a TMDS (transition minimized differential signaling) interface.

The timing controller TC may generate data control signals controlling the data driving circuit and gate control signals controlling the gate driving circuit using the external timing signals.

The timing controller TC is supplied with image data from the external system, and processes and supplies the image data to the data driving circuit.

The data driving circuit may include, for example, a plurality of data driving ICs DIC. The data IC DIC may be connected to the display panel 110 in a COG (chip on glass) or COF (chip on film) type configuration, and be electrically connected to the data line DL. In this embodiment, for the purpose of explanations, the data IC DIC in the COF type configuration is used.

The data IC DIC in the COF type configuration is mounted on a flexible printed circuit FF, and is connected to the display panel 110 and the driving board CB. Wiring patterns LL are formed at the flexible printed film FF, and transfer signals between the data IC DIC, and either the display panel 110 or the driving board CB.

The data driving circuit is supplied with the digital image data and the data control signals from the timing controller TC, and, in response to the control signals, outputs data voltages to the respective data lines DL. For example, according to the control signals, the data driving circuit converts the input image data in parallel form, converts the image data into analog data voltages in positive/negative polarities, and outputs the data voltages to the respective data lines DL.

The gate driving circuit may include, for example, a plurality of gate ICs. The gate IC may be connected to the display panel 110 in a COG (chip on glass) or COF (chip on film) type configuration, and be electrically connected to the gate line DL. Alternatively, the gate driving circuit may be configured in a GIP type configuration in which the gate driving circuit is directly formed at the array substrate 111.

The gate driving circuit sequentially outputs gate voltages to the gate lines GL according to the gate control signals supplied directly from the timing controller TC or via the data driving circuit. For the purpose of explanations, the gate driving circuit is not shown in the drawings.

The data IC and the data link line DLL are explained in more detail below.

Referring to FIG. 3, a plurality of output pads OP to output signals to the display panel 110 are formed at an end portion of the data IC DIC. The output pads OP correspond to and are electrically connected to the respective data pads DP of the data link lines DLL.

The plurality of output pads OP may include signal output pads OP1 configured to function to actually output signals, and dummy output pads OP2 configured to function to output no signals.

It is preferred that the dummy output pads OP2 are substantially positioned at a center portion of a region where the output pads OP are formed. In this case, regions where the signal output pads OP1 are arranged may be positioned symmetrically at both sides of a region where the dummy output pads OP2 are arranged.

The data pads DP are configured to correspond to the arrangement of the output pads OP. In this regard, the data pads DP may include signal input data pads DP1 which are configured to be connected to the respective data link lines DLL and to function to supply data voltages into the display panel 110, and dummy data pads DP2 which are configured to be not connected to the data link lines DLL and be electrically insulated.

The signal input data pads DP1 are connected to the signal output pads OP1. Accordingly, the signal input data pads DP1 can be supplied with the data voltages output from the data IC DIC. The data voltages supplied to the signal input data pads DP1 can be transferred to the respective data lines DL via the data link lines DLL connected to the signal input data pads DP1.

The dummy data pads DP2 are connected to the respective dummy output pads OP2. The dummy output pads OP2 make no output of signal, and the dummy data pads DP2 are electrically insulated in the array substrate 111, and thus signal transfer into the display panel 110 is not made. Accordingly, even though the dummy data pads DP2 and the dummy output pads OP2 are connected, the signal transfer therethrough is not conducted.

As described above, since the data pads DP are configured to correspond to the output pads OP, the arrangement of the data pads DP conforms to the arrangement of the output pads OP.

In other words, it is preferred that the dummy data pads DP2 are positioned at a center portion of a region where the data pads DP are arranged. In this case, regions where the signal input data pads DPI are arranged may be positioned symmetrically at both sides of the region where the dummy output pads OP2 are arranged.

Accordingly, both side regions, where the data link lines DLL connected to the signal input data pads DP1 at both sides are arranged, may be configured to each have a trapezoidal shape increasing in width along the direction inside the display panel 110 (i.e., the direction towards the display region AA), and to be symmetrical with each other. A dummy region, which has an inverted triangular shape decreasing in width along the direction inside the display panel 110, and in which no data link line is formed, may be positioned between the trapezoidal-shaped side regions.

Figure 5:
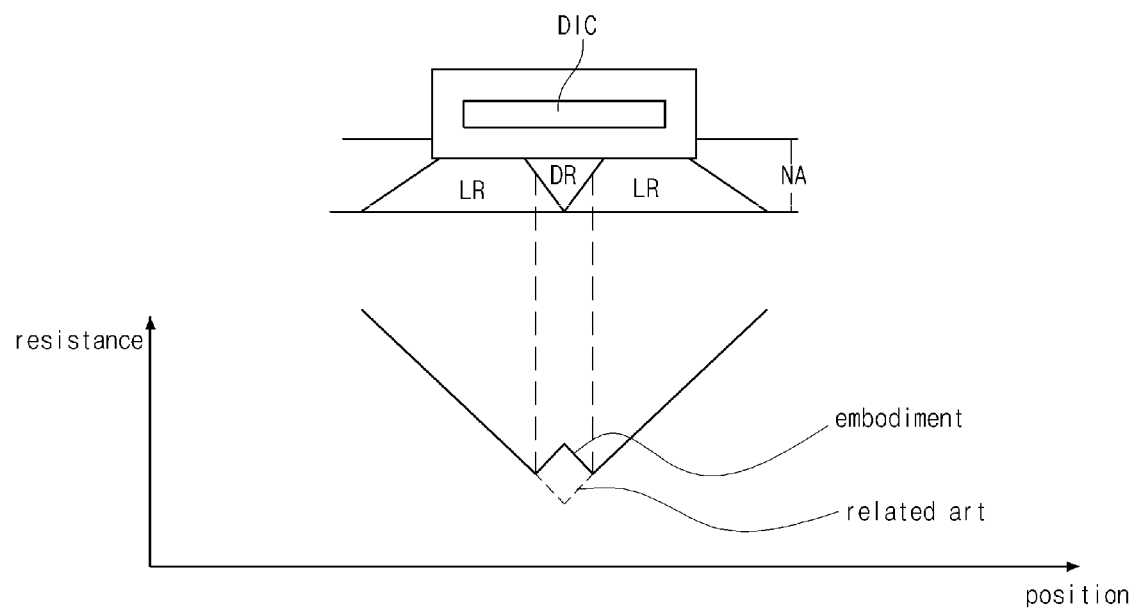
FIG. 5 is a view illustrating resistance distribution of the data link lines connected to the data IC according to an embodiment of the present invention.

According to the above configuration, length deviation among the data link lines DLL can be less than that of the related art. This is explained further with reference to FIG. 5, which is a view illustrating resistance distribution of the data link lines connected to the data IC according to an embodiment of the present invention.

For the purpose of explanations, both side regions of the data link lines DLL are referred to as link regions LR, and a reference "DR" indicates the dummy region.

In the related art shown in a dotted line, the data link lines DLL are arranged in the dummy region DR, and thus the length of data link line DLL decreases from the both sides to the center portion. Accordingly, resistance of the data link lines DLL decreases from both sides towards the center portion.

However, in the embodiment, the inverted triangular-shaped dummy region DR is positioned between both link regions LR. Accordingly, resistance of the data link lines DLL decreases and then turns to increase from both sides towards the center portion.

Accordingly, the resistance deviation of the embodiment can be less than that of the related art when a width of the non-display region NA (i.e., a distance from a side of the display panel 110 to the corresponding side of the display region AA) is the same between the embodiment and the related art.

Therefore, according to the embodiment, the width of the non-display region NA can be reduced, and thus a bezel of the display device can be reduced.

The display device 100 as above may be manufactured as follows.

The array substrate 111 is manufactured by forming array elements on a substrate. When forming the data pads DP, the signal input data pads DP1 are formed to be connected to the data link lines DLL, and the dummy data pads DL2 are formed in an electrically insulated state.

The array substrate 111 is coupled to an opposing substrate to manufacture the display panel 110. In case that the display panel 110 is a liquid crystal panel, a process of injecting a liquid crystal layer between the array substrate 111 and the opposing substrate is further performed.

The data driving circuit, the gate driving circuit, the driving board CB, and mechanical components are coupled to the display panel 110, and thus the display device 100 can be manufactured. The data driving circuit may include the data IC DIC having the signal output pads OP 1 and the dummy output pads OP2.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display device comprising:
a data IC including a plurality of dummy output pads, and a plurality of signal output pads that are positioned at both sides of the plurality of dummy output pads, a first subset of the plurality of signal output pads disposed to a left side of the plurality of output pads, and a second subset of the plurality of signal output pads disposed to a right side of the plurality of output pads;
a plurality of dummy data pads corresponding to the plurality of dummy output pads;
a plurality of signal input data pads that are positioned at both sides of the plurality of dummy data pads in a non-display region of an array substrate of a display panel, a first subset of the signal input data pads disposed to a left side of the dummy data pads and corresponding to the first subset of the signal output pads, and a second subset of the signal input data pads disposed to a right side of the dummy data pads and corresponding to the second subset of the signal output pads; and
a plurality of data link lines in the non-display region and connected between the plurality of signal input data pads and a plurality of data lines in a display region of the display panel, the data link lines including first data link lines connected between the first subset of the signal input data pads and a first subset of the data lines and second data link lines connected between the second subset of the signal input data pads and a second subset of the data lines, and wherein:
a first subset of the first data link lines are angled outward further away from the dummy data pads extending toward the display region; and
a second subset of the first data link lines are angled inward closer to the dummy data pads extending toward the display region.

2. The device according to claim 1, wherein the plurality of dummy data pads is in electrical insulation in the array substrate.

3. The device according to claim 1, wherein the first and second subsets of the plurality of signal output pads are symmetrical with each other, and wherein the first and second subsets of the plurality of signal input data pads are symmetrical with each other.

4. The device according to claim 1, wherein the display panel is a liquid crystal panel, a field emission display panel, a plasma display panel, an electroluminescent display panel, or an electrophoresis display panel.

5. A method of manufacturing a display device, the method comprising:
forming a display panel; and
coupling a data IC to the display panel,
wherein the data IC includes a plurality of dummy output pads, and a plurality of signal output pads that are positioned at both sides of the plurality of dummy output pads, a first subset of the plurality of signal output pads disposed to a left side of the plurality of output pads, and a second subset of the plurality of signal output pads disposed to a right side of the plurality of output pads, and
wherein the display panel includes:
a plurality of dummy data pads corresponding to the plurality of dummy output pads;
a plurality of signal input data pads that are positioned at both sides of the plurality of dummy data pads in a non-display region of an array substrate of a display panel, a first subset of the signal input data pads disposed to a left side of the dummy data pads and corresponding to the first subset of the signal output pads, and a second subset of the signal input data pads disposed to a right side of the dummy data pads and corresponding to the second subset of the signal output pads; and
a plurality of data link lines in the non-display region and connected between the plurality of signal input data pads and a plurality of data lines in a display region of the display panel, the data link lines including first data link lines connected between the first subset of the signal input data pads and a first subset of the data lines and second data link lines connected between the second subset of the signal input data pads and a second subset of the data lines, and wherein:
a first subset of the first data link lines are angled outward further away from the dummy data pads extending toward the display region; and
a second subset of the first data link lines are angled inward closer to the dummy data pads extending toward the display region.

6. The method according to claim 5, wherein the plurality of dummy data pads is in electrical insulation in the array substrate.

7. The method according to claim 5, wherein the first and second subsets of the plurality of signal output pads are symmetrical with each other, and wherein the first and second subsets of the plurality of signal input data pads are symmetrical with each other.

8. The method according to claim 5, wherein the display panel is a liquid crystal panel, a field emission display panel, a plasma display panel, an electroluminescent display panel, or an electrophoresis display panel.

9. The device according to claim 1, wherein:
a first subset of the second data link lines are angled outward further away from the dummy data pads extending toward the display region; and
a second subset of the second data link lines are angled inward closer to the dummy data pads extending toward the display region.

10. The method according to claim 5, wherein:
a first subset of the second data link lines are angled outward further away from the dummy data pads extending toward the display region; and
a second subset of the second data link lines are angled inward closer to the dummy data pads extending toward the display region.

* * * * *